(12) United States Patent
Sapp

(10) Patent No.: US 6,710,403 B2
(45) Date of Patent: Mar. 23, 2004

(54) DUAL TRENCH POWER MOSFET

(75) Inventor: Steven Sapp, Felton, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/209,110

(22) Filed: Jul. 30, 2002

(65) Prior Publication Data

US 2004/0021173 A1 Feb. 5, 2004

(51) Int. Cl.$^7$ .......................... H01L 29/76; H01L 29/94
(52) U.S. Cl. .................. 257/330; 257/228; 257/229; 257/341
(58) Field of Search ................ 257/330, 328, 257/329, 341

(56) References Cited

U.S. PATENT DOCUMENTS

| 3,404,295 A | 10/1968 | Warner et al. |
| 3,412,297 A | 11/1968 | Amlinger |
| 3,497,777 A | 2/1970 | Teszner et al. |
| 3,564,356 A | 2/1971 | Wilson |
| 4,003,072 A | 1/1977 | Matsushita et al. |
| 4,300,150 A | 11/1981 | Colak |
| 4,326,332 A | 4/1982 | Kenney et al. |
| 4,337,474 A | 6/1982 | Yukimoto |
| 4,579,621 A | 4/1986 | Hine |
| 4,638,344 A | 1/1987 | Cardwell, Jr. |
| 4,639,761 A | 1/1987 | Singer et al. |
| 4,698,653 A | 10/1987 | Cardwell, Jr. |
| 4,716,126 A | 12/1987 | Cogan |
| 4,746,630 A | 5/1988 | Hui et al. |
| 4,754,310 A | 6/1988 | Coe |
| 4,774,556 A | 9/1988 | Fujii et al. |
| 4,821,095 A | 4/1989 | Temple |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,967,245 A | 10/1990 | Cogan et al. |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,071,782 A | 12/1991 | Mori |
| 5,072,266 A | 12/1991 | Buluccea et al. |
| 5,079,608 A | 1/1992 | Wodarczyk et al. |
| 5,105,243 A | 4/1992 | Nakagawa et al. |
| 5,164,325 A | 11/1992 | Cogan et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,262,336 A | 11/1993 | Pike, Jr. et al. |
| 5,268,311 A | 12/1993 | Euen et al. |

(List continued on next page.)

FOREIGN PATENT DOCUMENTS

| DE | 4300806 A2 | 12/1993 |
| DE | 19736981 A1 | 8/1998 |
| EP | 0975024 A2 | 1/2000 |

(List continued on next page.)

OTHER PUBLICATIONS

US 6,166,983, 1/2001, Rumennik et al. (withdrawn)
US 6,388,267, 5/2002, Deboy et al. (withdrawn)

(List continued on next page.)

Primary Examiner—David Nelms
Assistant Examiner—Tu-Tu Ho
(74) Attorney, Agent, or Firm—Townsend and Townsend and Crew LLP

(57) ABSTRACT

In accordance with an embodiment of the present invention, a MOSFET includes a first semiconductor region of a first conductivity type, a gate trench which extends into the first semiconductor region, and a source trench which extends into the first semiconductor region. The source trench is laterally spaced from the gate trench.

11 Claims, 2 Drawing Sheets

U.S. PATENT DOCUMENTS

| | | |
|---|---|---|
| 5,275,965 A | 1/1994 | Manning |
| 5,294,824 A | 3/1994 | Okada |
| 5,298,781 A | 3/1994 | Cogan et al. |
| 5,300,447 A | 4/1994 | Anderson |
| 5,326,711 A | 7/1994 | Malhi |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,436,189 A | 7/1995 | Beasom |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,519,245 A | 5/1996 | Tokura et al. |
| 5,541,425 A | 7/1996 | Nishihara |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,689,128 A | 11/1997 | Hshieh et al. |
| 5,693,569 A | 12/1997 | Ueno |
| 5,710,072 A | 1/1998 | Krautschneider et al. |
| 5,719,409 A | 2/1998 | Singh et al. |
| 5,744,826 A * | 4/1998 | Takeuchi et al. ............... 257/77 |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,831,288 A * | 11/1998 | Singh et al. ................... 257/77 |
| 5,877,528 A | 3/1999 | So |
| 5,879,971 A | 3/1999 | Witek |
| 5,879,994 A | 3/1999 | Kwan et al. |
| 5,895,951 A | 4/1999 | So et al. |
| 5,895,952 A | 4/1999 | Darwish et al. |
| 5,897,360 A | 4/1999 | Kawaguchi |
| 5,906,680 A | 5/1999 | Meyerson |
| 5,917,216 A | 6/1999 | Floyd et al. |
| 5,929,481 A | 7/1999 | Hsieh et al. |
| 5,943,581 A | 8/1999 | Lu et al. |
| 5,949,124 A | 9/1999 | Hadizad et al. |
| 5,959,324 A | 9/1999 | Kohyama |
| 5,972,741 A | 10/1999 | Kubo et al. |
| 5,973,360 A | 10/1999 | Tihanyi |
| 5,976,936 A | 11/1999 | Miyajima et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenny et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,049,108 A | 4/2000 | Williams et al. |
| 6,057,558 A | 5/2000 | Yamamoto et al. |
| 6,066,878 A | 5/2000 | Neilson |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,156,606 A | 12/2000 | Michaelis |
| 6,156,611 A | 12/2000 | Lan et al. |
| 6,163,052 A | 12/2000 | Liu et al. |
| 6,168,996 B1 | 1/2001 | Numazawa et al. |
| 6,171,935 B1 | 1/2001 | Nance et al. |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,191,447 B1 | 2/2001 | Baliga |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,225,649 B1 | 5/2001 | Minato |
| 6,228,727 B1 | 5/2001 | Lim et al. |
| 6,239,464 B1 | 5/2001 | Tsuchitani et al. |
| 6,271,100 B1 | 8/2001 | Ballantine et al. |
| 6,271,562 B1 | 8/2001 | Deboy et al. |
| 6,274,905 B1 | 8/2001 | Mo |
| 6,277,706 B1 | 8/2001 | Ishikawa |
| 6,281,547 B1 * | 8/2001 | So et al. ...................... 257/330 |
| 6,285,060 B1 | 9/2001 | Korec et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,307,246 B1 | 10/2001 | Nitta et al. |
| 6,309,920 B1 | 10/2001 | Laska et al. |
| 6,313,482 B1 | 11/2001 | Baliga |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,921 B1 | 4/2002 | Hijzen et al. |
| 6,376,314 B1 | 4/2002 | Jerred |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,400,003 B1 | 6/2002 | Huang |
| 6,433,385 B1 | 8/2002 | Kocon et al. |

| | | | |
|---|---|---|---|
| 6,436,779 | B2 | 8/2002 | Hurkx et al. |
| 6,437,399 | B1 | 8/2002 | Huang |
| 6,441,454 | B2 | 8/2002 | Hijzen et al. |
| 6,452,230 | B1 | 9/2002 | Boden, Jr. |
| 6,465,304 | B1 | 10/2002 | Blanchard et al. |
| 6,465,843 | B1 | 10/2002 | Hirler et al. |
| 2001/0023961 | A1 | 9/2001 | Hsieh et al. |
| 2001/0028083 | A1 | 10/2001 | Onishi et al. |
| 2001/0032998 | A1 | 10/2001 | Iwamoto et al. |
| 2001/0041400 | A1 | 11/2001 | Ren et al. |
| 2001/0050394 | A1 | 12/2001 | Onishi et al. |
| 2002/0009832 | A1 | 1/2002 | Blanchard |
| 2002/0013029 | A1 * | 1/2002 | Hwang .................... 438/268 |
| 2002/0014658 | A1 | 2/2002 | Blanchard |
| 2002/0066924 | A1 | 6/2002 | Blanchard |
| 2002/0070418 | A1 | 6/2002 | Kinzer et al. |

FOREIGN PATENT DOCUMENTS

| | | |
|---|---|---|
| EP | 1028749 A1 | 8/2000 |
| EP | 1054451 A2 | 11/2000 |
| EP | 0747967 B1 | 2/2002 |
| EP | 1205980 A1 | 5/2002 |
| JP | 62-069562 | 3/1987 |
| JP | 63-186475 | 8/1988 |
| JP | 63-288047 | 11/1988 |
| JP | 64-022051 | 1/1989 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-111041 A | 2/2001 |
| JP | 2001-102577 A | 4/2001 |
| JP | 2001-135819 A | 5/2001 |
| JP | 2001-144292 A | 5/2001 |
| JP | 2001-244461 A | 9/2001 |
| JP | 2001-313391 A | 11/2001 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A2 | 12/2001 |
| WO | WO 02/01644 A2 | 1/2002 |
| WO | WO 02/047171 A1 | 6/2002 |

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries(1985).

Baliga "Options for CVD of Dielectrics Include Low–k Materials," Technical Literature from Semiconductor International Jun. 1998.

Bulucea "Trench DMOS Transistor Technology For High Current (100 A Range) Switching" Solid–State Electronics vol. 34, No. pp. 493–507 (1991).

Chang et al. "Numerical and experimental Analysis of 500–V Power DMOSFET with an Atomic–Lattice Layout," IEEE Transactions on Electron Devices 38:2623 (1989).

Chang et al. "Self–Aligned UMOSFET's with a Specific On–Resistance of 1mO $cm^2$," IEEE Transactions Electron Devices 34:2329–2333 (1987).

Curtis, et al. "APCVD TEOS: 03 Advanced Trench Isolation Applications," Semiconductor Fabtech 9th Edition (1999).

Fujihira "Theory of Semiconductor Superjunction Devices" Jpn. J. Appl. Phys. Vol 36 pp. 6254–6252 (1997).

Gan et al. "Poly Flanked VDMOS (PFVDMOS): A Superior Technology for Superjunction Devices," IEEE Power Electronics Specialists Conference, Jun. 17–22, 2001, Vancouver, Canada (2001).

Glenn et al. "A Novel Vertical Deep Trench Resurf DMOS (VTR–DMOS)" IEEE ISPD 2000, May 22–25, Toulouse France.

Kao et al. "Two Dimensional Thermal Oxidation of Silicon–I. Experiments,", *IEEE Transactions on Electron Devices*, vol. ED–34, No. 5, May 1987.

Kao et al. "Two Dimensional Thermal Oxidation of Silicon–II. Modeling Stress Effects in Wet Oxides,", *IEEE Transactions on Electron Devices*, vol. ED–35, No. 1, Jan. 1988.

Lorenz et al. "Cool MOS–An important milestone towards a new power MOSFET generation" Power Conversion pp. 151–160 (1988).

Moghadam "Delivering Value Around New Industry Paradigms," Technical Literature from Applied Materials, pp. 1–11, vol. 1, Issue 2, Nov. 1999.

Shenoy et al. "Analysis of the Effect of Charge Imbalance on the Static and Dynamic Characteristic of the Super Junction MOSFET," IEEE International Symposium on Power Semiconductor Devices 1999, pp. 99–102 (1999).

Singer "Empty Spaces in Silicon (ESS): An Alternative to SOI," Semiconductor International p. 42, Dec. 1999.

Ueda et al. "An Ultra–Low On–Resistance Power MOSFET Fabricated by Using a Fully Self–Aligned Process," IEEE Transactions on Electron Devices 34:926–930 (1987).

Wilamowski "Schottky Diodes with High Breakdown Voltages," Solid–State Electronics 26:491–493 (1983).

Wolf "Silicon Processing for The VLSI Era" vol. 2 Process Integration Lattice Press (1990).

"CoolMOS™ the second generation, " Infineon Technologies product information (2000).

"IR develops CoolMOS™ –equivalent technology, positions it at the top of a 3–tiered line of new products for SMPS," International Rectifiers company information available at http://www.irf.com (1999).

Technical Literature from Quester Technology, Model APT–4300 300mm Atmospheric TEOS/Ozone CVD System (unknown date).

Technical Literature from Quester Technology, Model APT–6000 Atmospheric TEOS–Ozone CVD System (unknown date).

Technical Literature from Silicon Valley Group Thermal Systems, APNext, High Throughput APCVD Cluster Tool for 200 mm/300 mm Wafer Processing (unknown date).

* cited by examiner

DUAL TRENCH POWER MOSFET

CROSS-REFERENCES TO RELATED APPLICATION

The present application incorporates herein by reference commonly assigned U.S. application Ser. No. 08/970,221, filed on Nov. 14, 1997, entitled "Field Effect Transistor and Method of its Manufacture".

BACKGROUND OF THE INVENTION

Power MOSFETs (metal oxide field effect transistors) are well known in the semiconductor industry. Two types of known power MOSFET cell structures are shown in FIGS. 1 and 2. FIG. 1 is a cross section view of a conventional vertically-conducting UMOS structure, and FIG. 2 is a cross section view of a power MOSFET with source trenches and planar gate structure.

In FIG. 1, gates 110a,b are formed in gate trenches 113a,b extending from the top surface through body region 106, and terminating in n-type epitaxial region 104. Vertical channels are formed between source regions 114a,b and epitaxial region 104 along the sidewalls of gate trenches 113a,b. Although this structure has a relatively low on-resistance and enables high packing density due the vertical gate structure, it suffers from high input capacitance (i.e., high gate to source and gate to drain capacitance) due to the long channel length and the large number of gates of a highly packed device.

In FIG. 2, a conventional double-diffused MOS (DMOS) planar surface structure is combined with source trenches 213a,b. Source trenches 213a,b extend from the top surface into epitaxial region 204, and are filled with conductive material 216a,b (e.g., polysilicon). Conductive material 216a,b are insulated from epitaxial region 204 and body regions 206a,b by a layer of insulating material 212a,b, but are electrically connected to the body/source regions through the top metal layer 218. A maximum forward blocking voltage, hereinafter referred to as "the breakdown voltage", is determined by the avalanche breakdown voltage of the reverse-biased body-drain junction. Source trenches 213,b help achieve a higher breakdown voltage by causing the electric field to spread deeper into epitaxial region 204. This structure however suffers from the same horizontal limitations (e.g., packing density and JFET resistance) as conventional planar DMOS structures.

Thus, there is a need for a power MOSFET structure which, among other advantages and features, exhibits low input capacitance, high breakdown voltage, improved packing density, and low on-resistance.

BRIEF SUMMARY OF THE INVENTION

In accordance with an embodiment of the present invention, a MOSFET includes a first semiconductor region of a first conductivity type, a gate trench which extends into the first semiconductor region, and a source trench which extends into the first semiconductor region. The source trench is laterally spaced from the gate trench.

In one embodiment, the source trench extends deeper into the first semiconductor region than the gate trench.

In another embodiment, the MOSFET further includes a body region and a source region. The body region is in the first semiconductor region between the source trench and the gate trench. The body region is of opposite conductivity type as the first semiconductor region. The source region is in the body region such that a channel is formed in the body region along a sidewall of the gate trench. The source region is of the same conductivity type as the first semiconductor region.

In accordance with another embodiment of the present invention, a method of forming a MOSFET is as follows. A first semiconductor region of a first conductivity type is formed. A gate trench extending into the first semiconductor region is formed. A source trench extending into the first semiconductor region is formed. The source trench is laterally spaced from the gate trench.

In one embodiment, a body region is formed in the first semiconductor region between the source trench and the gate trench. The body region is of opposite conductivity type as the first semiconductor region. A source region is formed in the body region such that a channel is formed in the body region along a sidewall of the gate trench. The source region is of the same conductivity type as the first semiconductor region.

The following detailed description and the accompanying drawings provide a better understanding of the nature and advantages of the present invention.

DETAILED DESCRIPTION OF THE INVENTION

Figure 1:
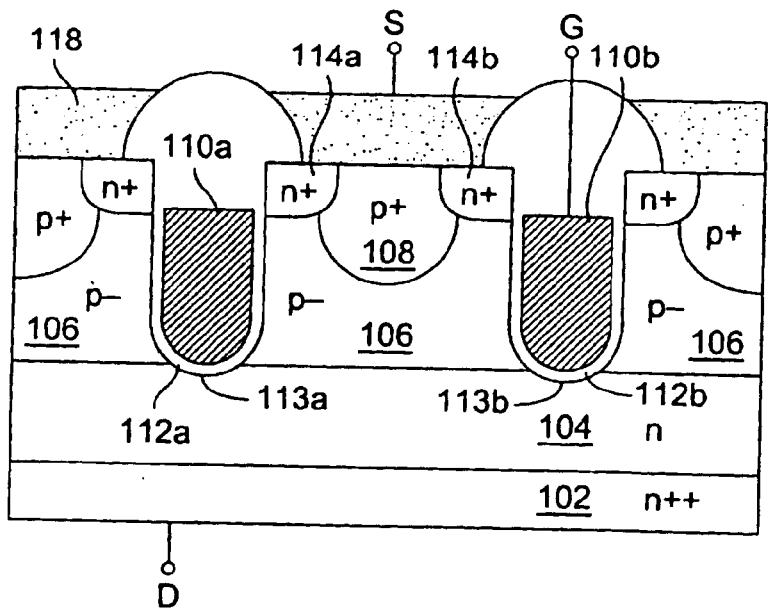
FIG. 1 is a cross section view of a conventional UMOS structure.
Figure 2:
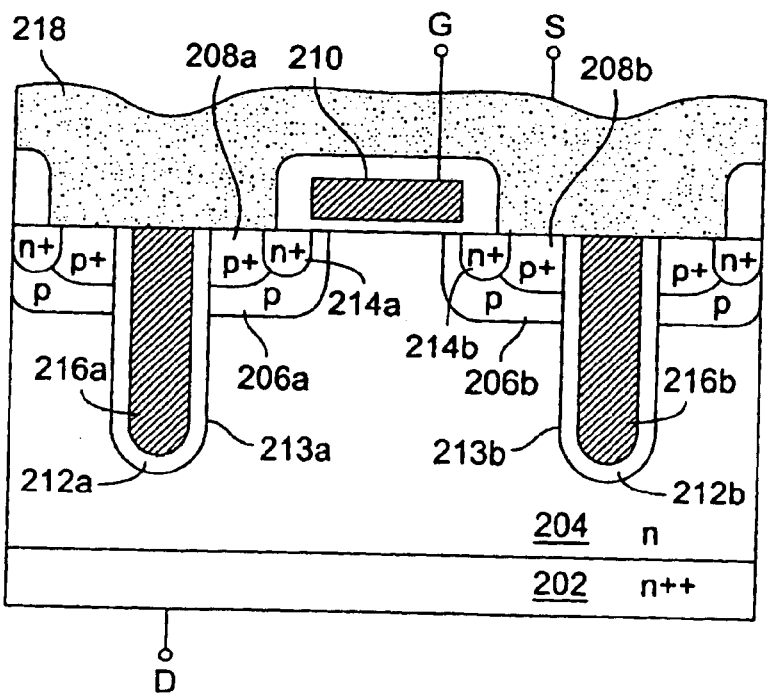
FIG. 2 is a cross section view of a known DMOS structure.

A power MOSFET structure and method of manufacturing the same are described in accordance with the present invention. The power MOSFET structure conducts vertically and includes two trenches, a source trench and a shallower gate trench. The gate trench structure achieves low input capacitance and higher packing density, while the source trench achieve a higher breakdown voltage and allows the channel length (and thus the on-resistance) to be substantially reduced compared to the UMOS structure (FIG. 1).

Figure 3:
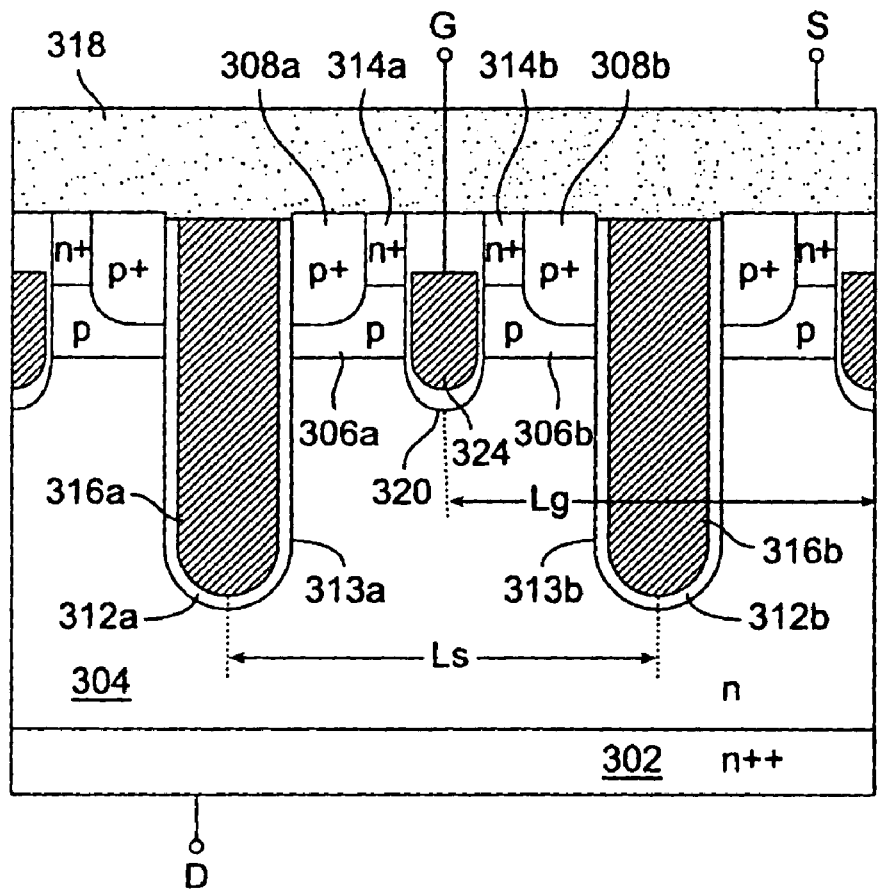
FIG. 3 is a cross section view of a MOSFET structure in accordance with the present invention.

FIG. 3 is a cross section view of a power MOSFET structure in accordance with the present invention. FIG. 3 shows two of an array of cells. A representative cell includes n-type source region 314a in p-type body region 306a. Body region 306a is in n-type epitaxial region 304 which extends over n-type substrate 302. Body region 306a includes a highly doped p+ region 308a to reduce the body resistance, prevent punch-through to source region 314a, and improve unclamped inductive load switching ruggedness.

The representative cell further includes gate trench 320 and source trench 313a. Source region 314a, p+ region 308a, and body region 306a are located between gate trench 320 and source trench 313a. Gate trench 320 is shallower than source trench 313a as shown. Gate trench 320 and source trench 313a are filled with conductive material 324 and 316a respectively. Conductive material 324 in gate trench 320 forms the transistor gate and is insulated from the vertical channel region by gate oxide. Conductive material 316a in source trench 313a is insulated from the epitaxial region 304 and body region 306a by an insulating layer 312a. A metal layer 318 along the top surface contacts source regions 314a,b, conductive material 316a,b in source trenches 313a,b, and body regions 306a,b through p+ regions 308a,b. Metal layer 318 is however insulated from gate 324 as shown.

A sequence of process steps for forming the MOSFET structure in FIG. 3 is as follows. Conventional process steps are carried out to form the buried gate UMOS structure including the source and body regions. Alternatively, the process steps outlined in the above-referenced U.S. patent application (Ser. No. 08/970,221, titled "Field Effect Transistor and Method of its Manufacture") may be carried out to form the buried gate, source-body structure. Next, deep trenches are etched in the space between the gate regions. The deep trench surfaces are then cleaned and a thin layer of thermal oxide is gown inside the deep trenches. A thicker (e.g. 200–600 nm) insulating layer (e.g., CVD oxide) is then deposited over the thin layer of thermal oxide. The fill material in the deep trenches can either be recessed into body region 308a,b and 306a,b, or on plane with the other surfaces, or minimally recessed relative to the other surfaces. A layer of metal is then formed on top of the structure.

In an alternative embodiment the process steps are reversed in that the deep source trenches are formed first (using the same steps indicated above), and then the buried gate UMOS structure is formed between the source trenches (using the same process steps indicated above).

In one embodiment wherein the cell structure is optimized for 20–30V applications, a lateral spacing Lg between a center vertical axis of each of two adjacent gate trenches is in the range of 2–5 $\mu$m, a lateral spacing Ls between a center vertical axis of each of two adjacent source trenches is in the range of 1.5–2.5 $\mu$m, source trench 313a has a depth in the range of 1.5–3 $\mu$m, the gate trench 320 has a depth in the range of 0.5–1.2 $\mu$m, the gate oxide has a thickness in the range of 20–50 nm, and the source trench oxide layer 312a has a thickness in the range of 200–800 nm. The conductive material in the source and gate trenches is doped polysilicon, body regions 306a,b have a doping in the range of $5\times10^{16}$ cm$^{-3}$ to $5\times10^{17}$ cm$^{-3}$, source regions 314a,b have a doping in the range of $1\times10^{19}$ cm$^{-3}$ to $1\times10^{20}$ cm$^{-3}$, and epitaxial region have a doping in the range of $1\times10^{16}$ cm$^{-3}$ to $6\times10^{16}$ cm$^{-3}$. In one embodiment, the doping in the epitaxial region is graded, with doping concentration gradually increasing form the top surface to the substrate interface.

The MOSFET structure in FIG. 3 has a high breakdown voltage due to the source trenches 318a,b. Conductive regions 316a,b cause the depletion layer formed as a result of the reverse-biased body-drain junction to be pushed deeper into the drift region (i.e., the portion of the epitaxial region between source trenches 313a and 313b). By increasing the depletion region depth without increasing the electric field, a more highly doped epitaxial material can support a higher breakdown voltage than suggested by the normally accepted trade-off relationship Rsp $\alpha$ $V_{BR}^{2.5}$, where $V_{BR}$ represents the breakdown voltage and Rsp represents the on-resistance. Moreover, the reduced electric field near the body-drain junction allows the channel length to be substantially reduced which further reduces the on-resistance and substantially reduces the gate to source capacitance. Also, as compared to the conventional UMOS structure in FIG. 1, the much shorter channel length of the FIG. 3 structure enables obtaining the same device current capacity with far fewer gate trenches. This significantly reduces the input capacitance (both gate to source and gate to drain capacitance).

Because of the low gate to source capacitance Cgs, low gate to drain capacitance Cgd, and the low on-resistance of this structure, the high frequency figure of merit (namely, Qgs and $R_{SP}\times$Qgd, where Qgs and Qgd represent the gate-source and gate-drain charge per unit area respectively) which inversely tracks switching performance is dramatically improved.

Figure 4:
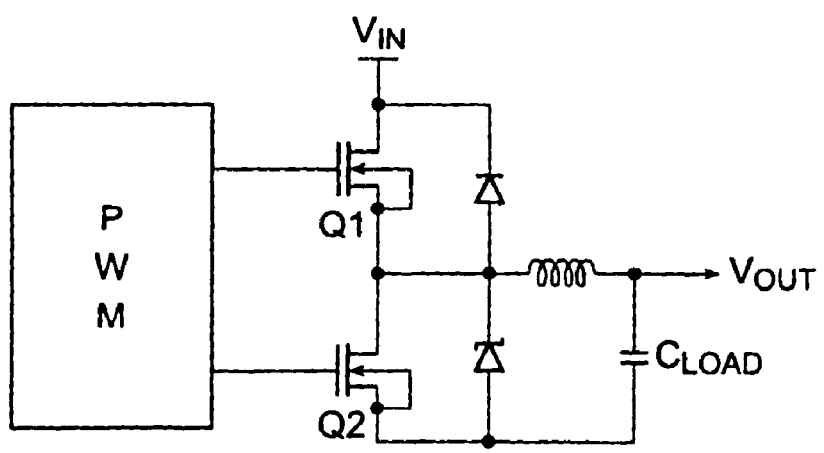
FIG. 4 is a circuit diagram of a DC/DC converter using the MOSFET structure in FIG. 3.

The MOSFET structure in FIG. 3 can be advantageously used in electronic devices such as computers and portable telephones to perform the DC/DC voltage conversion. High DC/DC converter efficiency depends on low power consumption in the power MOSFET switches which transfer power from the power source to the load. A typical buck converter high-side switch Q1 shown in FIG. 4 generates most of its losses during switching transitions, but on-state conduction losses can also be a problem. In such switches, the supply voltage $V_{IN}$ is reduced to the output voltage $V_{out}$ by turning on MOSFET switch Q1 for a duration equal to (Vout/$V_{IN}$)% of the time, commonly referred to as the transistor duty cycle $\Delta$. For example, for $V_{IN}$ of 12V and Vout of 1.2V, Q1 would be on only 10% of the time. The switch losses are proportional to CVf$\Delta$ wherein the capacitance C is the MOSFET parasitic output capacitance Coss, V is the voltage across switch Q1, and f is the operating frequency. Close examination of the switch reveals that the voltage transition occurs during the Miller transition. The "Miller charge" is represented by $Q_{GD}$. One of the advantages of the structure in FIG. 3 is that a low $Q_{GD}$ is obtained while the on-resistance is decreased. The faster switching time along with lower $Q_{GD}$ results in lower power loss during switching. In FIG. 3, $Q_{GD}$ is further reduced by making the oxide along the bottom of gate trench 320 thicker than the gate oxide.

Thus, high switching speed and low switching power loss are achieved by lowering the on-resistance and keeping $Q_{GD}$ and $Q_{GS}$ at a minimum. Also, the electric field at the body-drain junction is reduced, the channel length is reduced (e.g., to less than 0.2 $\mu$m), and the gate trench depth is reduced (e.g., to less than 0.6 $\mu$m).

Although the FIG. 3 structure shows the drain to be located along the bottom-side of the die, the invention is not limited as such. This cell structure can be modified to become a quasi-vertically conducting structure by including a highly-doped n-type buried layer extending along the interface between the epitaxial region and the underlying highly-doped substrate region. At convenient locations, the buried layer is extended vertically to the top surface where it can be contacted to form the drain terminal of the device. In this embodiment, the substrate region may be n-type or p-type depending on the application of the MOSFET.

While the above is a complete description of the embodiments of the present invention, it is possible to use various alternatives, modifications and equivalents. For example, FIG. 3 shows an n-channel power MOSFETs. Designing an equivalent p-channel MOSFET would be obvious to one skilled in the art in light of the above teachings. Also, the cross sectional views are intended for depiction of the various regions in the different structures and do not necessarily limit the layout or other structural aspects of the cell array. Therefore, the scope of the present invention should be determined not with reference to the above description but should, instead, be determined with reference to the appended claim, along with their full scope of equivalents.

What is claimed is:

1. A MOSFET comprising:
   a first semiconductor region of a first conductivity type;
   a gate trench extending into the first semiconductor region; and a source trench extending deeper into the first semiconductor region than the gate trench, the source trench being laterally spaced from the gate trench.

2. The MOSFET of claim 1 further comprising:

a body region in the first semiconductor region between the source trench and the gate trench, the body region being of opposite conductivity type as the first semiconductor region; and a source region in the body region such that a channel is formed in the body region along a sidewall of the gate trench, the source region being of same conductivity type as the first semiconductor region.

3. The MOSFET of claim 2 wherein:

the gate trench includes conducting material insulated from the first semiconductor region, the source trench includes conducting material insulated from the first semiconductor material, and the conductive material in the source trench is coupled to the source region.

4. The MOSFET of claim 3 wherein the conducting material in the gate trench is insulated from the first semiconductor region by an insulating layer having a greater thickness than a thickness of an insulating layer between the conducting material in the gate trench and the channel.

5. The MOSFET of claim 2 further comprising a second semiconductor region of the same conductivity type as the first semiconductor region, the first semiconductor region being over and in contact with the second semiconductor region, the second semiconductor region forming a drain contact region.

6. The MOSFET of claim 5 wherein the MOSFET conducts vertically between the drain region and the source region when in the on state.

7. A method of forming a MOSFET, comprising:

forming a first semiconductor region of a first conductivity type;

forming a gate trench extending into the first semiconductor region; and forming a source trench extending deeper into the first semiconductor region than the gate trench, the source trench being laterally spaced from the gate trench.

8. The method of claim 7 further comprising:

forming a body region in the first semiconductor region between the source trench and the gate trench, the body region being of opposite conductivity type as the first semiconductor region; and forming a source region in the body region such that a channel is formed in the body region along a sidewall of the gate trench, the source region being of same conductivity type as the first semiconductor region.

9. The method of claim 8 further comprising:

filling the gate trench with conducting material insulated from the first semiconductor region, filling the source trench with conducting material insulated from the first semiconductor material, wherein the conductive material in the source trench is coupled to the source region.

10. The method of claim 8 further comprising:

forming a second semiconductor region of the same conductivity type as the first semiconductor region, the first semiconductor region being over and in contact with the second semiconductor region, the second semiconductor region forming a drain contact region.

11. The method of claim 9 wherein the conducting material in the gate trench is insulated from the first semiconductor region by an insulating layer having a greater thickness than a thickness of an insulating layer between the conducting material in the gate trench and the channel.

* * * * *